(12) United States Patent
Mayumi

(10) Patent No.: US 12,051,707 B2
(45) Date of Patent: Jul. 30, 2024

(54) IMAGING ELEMENT UNIT AND IMAGING DEVICE

(71) Applicant: FUJIFILM Corporation, Tokyo (JP)

(72) Inventor: Kazuya Mayumi, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 455 days.

(21) Appl. No.: 17/455,761

(22) Filed: Nov. 19, 2021

(65) Prior Publication Data

US 2022/0085087 A1 Mar. 17, 2022

Related U.S. Application Data

(63) Continuation of application No. PCT/JP2020/015886, filed on Apr. 8, 2020.

(30) Foreign Application Priority Data

Jul. 1, 2019 (JP) ................................ 2019-123076

(51) Int. Cl.
*H01L 27/146* (2006.01)
*H04N 23/51* (2023.01)

(52) U.S. Cl.
CPC ....... *H01L 27/14618* (2013.01); *H04N 23/51* (2023.01)

(58) Field of Classification Search
CPC ... H01L 23/02; H01L 27/14618; H04N 23/51; H04N 25/00
See application file for complete search history.

(56) References Cited

U.S. PATENT DOCUMENTS

2010/0053407 A1* 3/2010 Crisp ...................... H01L 24/14
257/E31.097
2013/0098654 A1* 4/2013 Iizuka .................. H05K 5/0095
174/50

(Continued)

FOREIGN PATENT DOCUMENTS

JP 2000-012719 A 1/2000
JP 2005-341522 A 12/2005

(Continued)

OTHER PUBLICATIONS

International Search Report issued in PCT/JP2020/015886; mailed Jun. 30, 2020.

(Continued)

*Primary Examiner* — Amy R Hsu
(74) *Attorney, Agent, or Firm* — Studebaker & Brackett PC

(57) ABSTRACT

A package includes a flat portion to which an imaging element chip is fixed, a wall portion surrounding a fixed surface of the imaging element chip in the flat portion, and a plurality of first terminals electrically connected to the imaging element chip. A protective cover seals the imaging element chip in a state where the protective cover overlaps the wall portion. A conductive member is provided between the first terminal exposed from a rear surface of the package and a second terminal formed on a circuit board disposed to face the rear surface of the package to fix the package and the circuit board and electrically connect the first terminal and the second terminal to each other. The protective cover and the wall portion are fixed by an adhesive having a Young's modulus of 500 MPa or more.

20 Claims, 9 Drawing Sheets

(56) References Cited

U.S. PATENT DOCUMENTS

| | | | |
|---|---|---|---|
| 2014/0008753 A1* | 1/2014 | Tsuduki | H01L 31/02366 |
| | | | 257/433 |
| 2020/0051887 A1* | 2/2020 | Aoki | H05K 1/181 |
| 2020/0103613 A1* | 4/2020 | Shen | H01L 27/14618 |
| 2020/0358973 A1 | 11/2020 | Mayumi | |
| 2023/0421683 A1* | 12/2023 | McGuire | H04M 1/724631 |

FOREIGN PATENT DOCUMENTS

| | | |
|---|---|---|
| JP | 2006-303482 A | 11/2006 |
| JP | 2009-176961 A | 8/2009 |
| JP | 2011-018747 A | 1/2011 |
| JP | 2011-071422 A | 4/2011 |
| JP | 2014-017334 A | 1/2014 |
| JP | 2014-045048 A | 3/2014 |
| JP | 2015-038996 A | 2/2015 |
| JP | 2015-076680 A | 4/2015 |
| JP | 2015-170638 A | 9/2015 |
| JP | 2016-207999 A | 12/2016 |
| WO | 2019/146492 A1 | 8/2019 |

OTHER PUBLICATIONS

International Preliminary Report on Patentability and Written Opinion issued in PCT/JP2020/015886; issued Dec. 28, 2021.
An Office Action; "Notice of Reasons for Refusal," mailed by the Japanese Patent Office on Aug. 23, 2022, which corresponds to Japanese Patent Application No. 2021-529892 and is related to U.S. Appl. No. 17/455,761; with English language translation.

\* cited by examiner

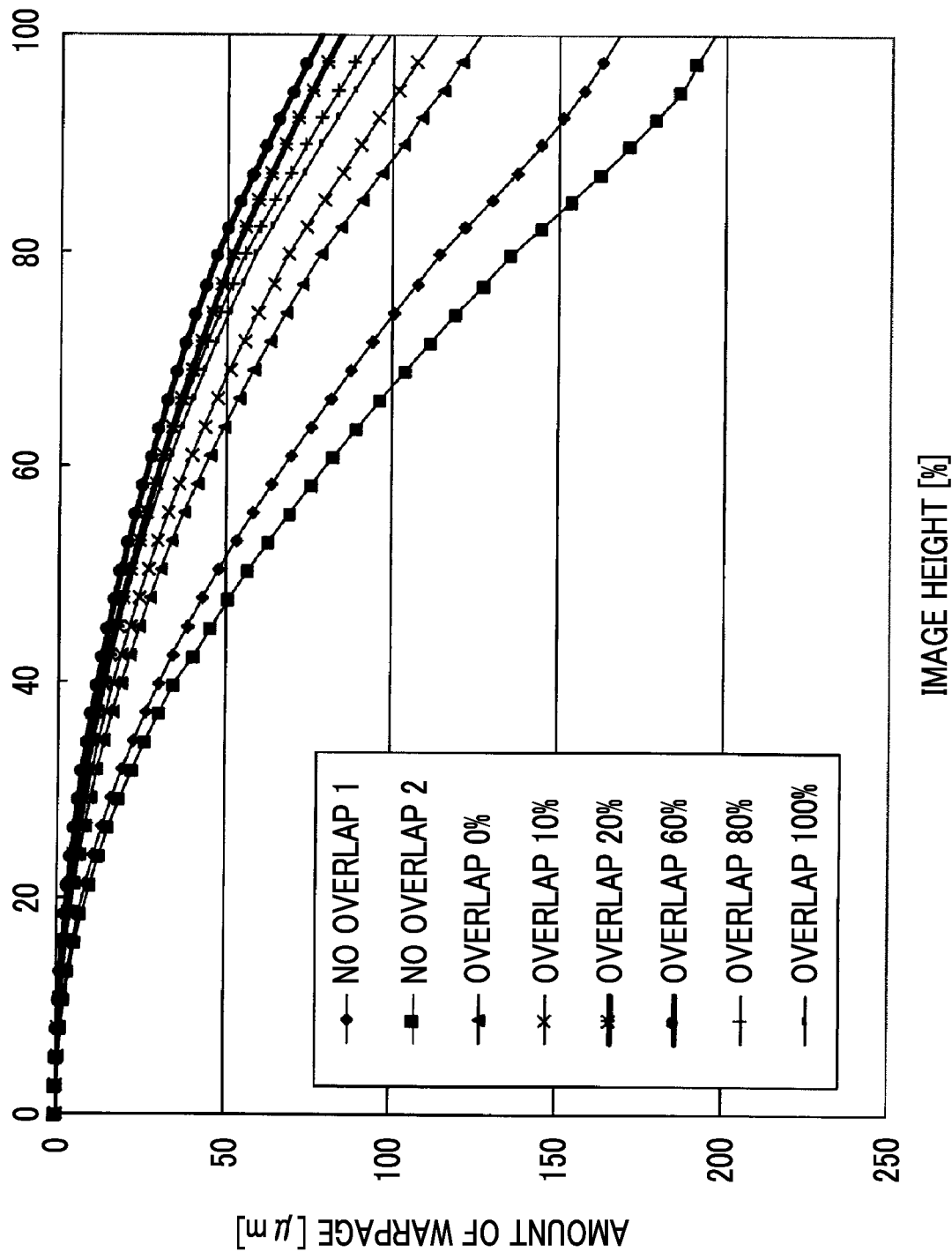

IMAGING ELEMENT UNIT AND IMAGING DEVICE

CROSS-REFERENCE TO RELATED APPLICATIONS

This application is a Continuation of PCT International Application No. PCT/JP2020/015886 filed on Apr. 8, 2020, which claims priority under 35 U.S.C. § 119(a) to Japanese Patent Application No. 2019-123076 filed on Jul. 1, 2019. Each of the above application(s) is hereby expressly incorporated by reference, in its entirety, into the present application.

BACKGROUND OF THE INVENTION

1. Field of the Invention

The present invention relates to an imaging element unit and an imaging device.

2. Description of the Related Art

Recently, there has been a rapid increase in demand for an information device having an imaging function, such as a digital still camera, a digital video camera, a portable telephone such as a smartphone, a tablet terminal, and an endoscope in accordance with an increase in resolution of an imaging element such as a charge coupled device (CCD) image sensor or a complementary metal oxide semiconductor (CMOS) image sensor. An electronic device having an imaging function as described above is referred to as an imaging device.

The imaging device comprises an imaging unit including an imaging element chip that is a semiconductor chip, a package that houses the imaging element chip, and a circuit board on which the package is mounted.

JP2009-176961A, JP2011-071422A, and JP2015-038996A disclose a structure of a unit including an electronic component, a package that houses the electronic component, and a circuit board on which the package is mounted.

SUMMARY OF THE INVENTION

In a case where the package that houses the semiconductor chip is mounted on the circuit board, the unit is placed in a state of a high temperature in a step of electrically connecting the package and the circuit board to each other with a solder. In a case where the temperature of the unit decreases after completion of this step, a warpage due to a bimetal effect occurs due to a difference in linear expansion coefficients of components of the unit.

In a case where the semiconductor chip is an imaging element chip, a flatness of a light receiving surface of the imaging element chip cannot be ensured due to a warpage caused by a bimetal effect. In a case where the light receiving surface warps in this way, a focus shifts around the light receiving surface, which affects an image quality. In a case where a size of the imaging element chip is large, it is particularly important to take measures against a warpage due to a bimetal effect. JP2009-176961A, JP2011-071422A, and JP2015-038996A do not recognize such a problem of the warpage of the imaging element chip.

The present invention has been made in view of the above circumstances, and an object of the present invention is to provide an imaging element unit capable of improving an image quality by preventing a warpage of an imaging element chip, and an imaging device comprising the imaging element unit.

An imaging element unit of an aspect of the present invention is an imaging element unit that is fixed to a circuit board through a conductive member, the imaging element unit comprising: a fixing member that includes a flat portion to which an imaging element chip is fixed, a wall portion surrounding a fixed surface of the imaging element chip in the flat portion, and a plurality of first terminals electrically connected to the imaging element chip, and that has a linear expansion coefficient smaller than a linear expansion coefficient of the circuit board to which the imaging element unit is fixed; and a sealing member that seals the imaging element chip in a state where the sealing member overlaps the wall portion, in which the sealing member and the wall portion are fixed by an adhesive having a Young's modulus of 500 MPa or more.

Alternatively, an imaging element unit of an aspect of the present invention is an imaging element unit that is fixed to a circuit board through a conductive member, the imaging element unit comprising: a fixing member that includes a flat portion to which an imaging element chip is fixed, a wall portion surrounding a fixed surface of the imaging element chip in the flat portion, and a plurality of first terminals electrically connected to the imaging element chip, and that has a linear expansion coefficient smaller than a linear expansion coefficient of the circuit board to which the imaging element unit is fixed; and a sealing member that seals the imaging element chip in a state where the sealing member overlaps the wall portion, in which the sealing member and the wall portion are fixed by an adhesive having a Young's modulus of less than 500 MPa and a thickness of 15 μm or less.

An imaging device of an aspect of the present invention comprises: the imaging element unit; the circuit board; and the conductive member provided between the first terminal exposed from a surface of the fixing member opposite to the fixed surface and a second terminal formed on the circuit board disposed to face the surface of the fixing member opposite to the fixed surface, to fix the fixing member and the circuit board and electrically connect the first terminal and the second terminal to each other.

According to the present invention, it is possible to provide an imaging element unit capable of improving an image quality by preventing a warpage of an imaging element, and an imaging device including the imaging element unit.

BRIEF DESCRIPTION OF THE DRAWINGS

FIG. 9 is a graph showing results obtained by simulating the amount of warpage of the imaging element chip 1 in the imaging unit 50 for each overlap ratio.

DESCRIPTION OF THE PREFERRED EMBODIMENTS

Hereinafter, embodiments of the present invention will be described with reference to the drawings.

Figure 1:
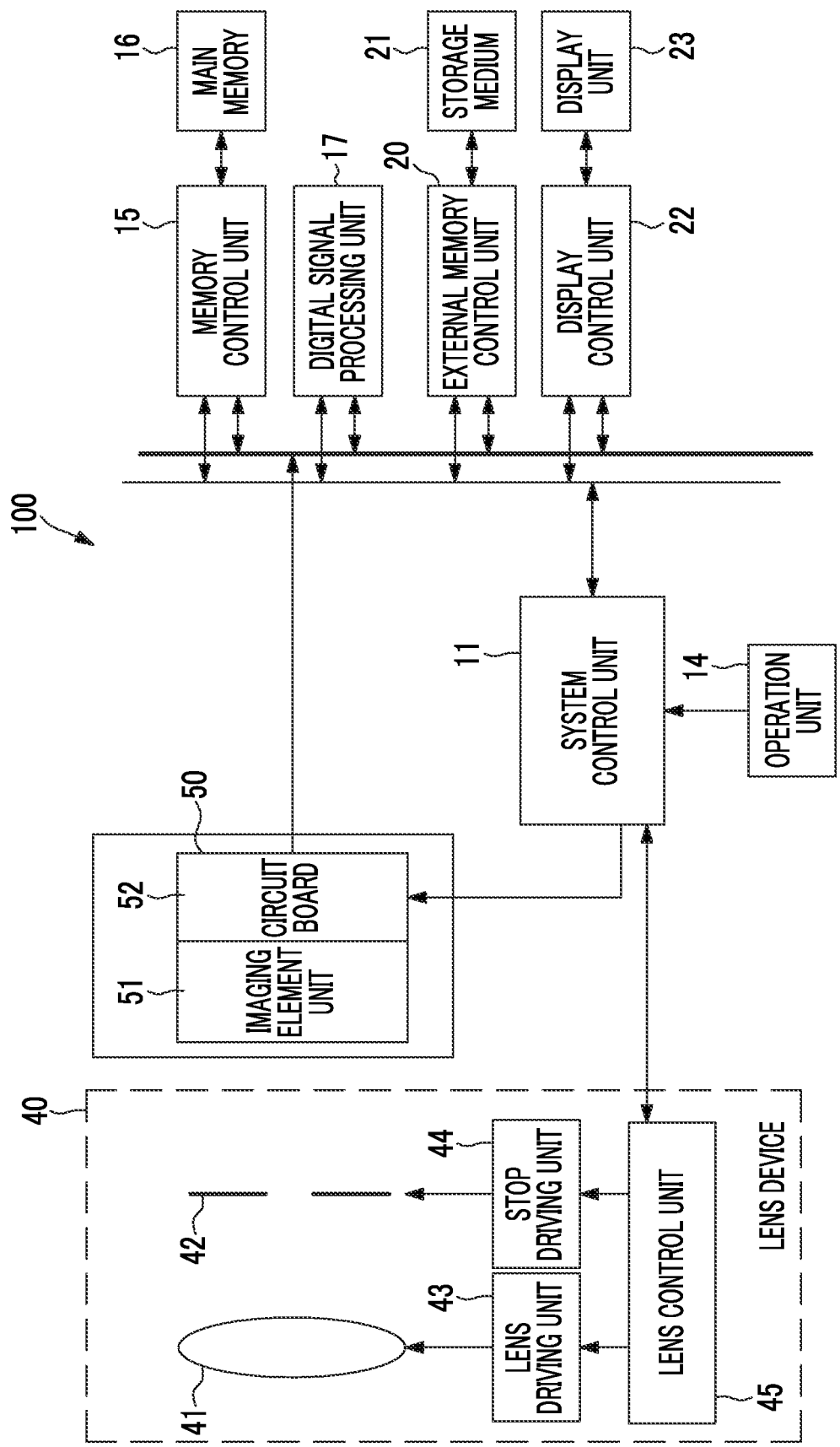
FIG. 1 is a diagram showing a schematic configuration of a digital camera 100 that is an imaging device of an embodiment of the present invention.

FIG. 1 is a diagram showing a schematic configuration of a digital camera 100 that is an embodiment of an imaging device of the embodiment of the present invention.

The digital camera 100 shown in FIG. 1 comprises a lens device 40 including an imaging lens 41, a stop 42, a lens driving unit 43, a stop driving unit 44, and a lens control unit 45.

The lens device 40 may be attachable and detachable from a main body of the digital camera 100, or may be integrated with the main body of the digital camera 100.

The imaging lens 41 includes a focus lens or a zoom lens that can move in an optical axis direction. An imaging optical system is composed of the imaging lens 41 and the stop 42.

The lens control unit 45 of the lens device 40 is configured to be able to communicate with a system control unit 11 of the digital camera 100 by wire or wireless.

According to a command from the system control unit 11, the lens control unit 45 changes a position of a principal point of the focus lens by driving the focus lens included in the imaging lens 41 via the lens driving unit 43, or controls the aperture amount of the stop 42 via the stop driving unit 44.

The digital camera 100 further comprises an imaging unit 50 for imaging a subject through an imaging optical system, the system control unit 11, and an operation unit 14.

The imaging unit 50 comprises an imaging element unit 51 such as a CCD image sensor or a CMOS image sensor, and a circuit board 52. The imaging element unit 51 is fixed to the circuit board 52 via a conductive member 7 described below.

The imaging element unit 51 has a light receiving surface (light receiving surface 10 in FIG. 3 which will be described later) in which a plurality of pixels are two-dimensionally arranged, and converts an image of the subject formed on the light receiving surface by the imaging optical system into an electric signal (pixel signal) by the plurality of pixels and outputs the electric signal.

The system control unit 11 drives the imaging element unit 51 to output the image of the subject captured through the imaging optical system of the lens device 40 as a captured image signal.

A command signal from a user is input to the system control unit 11 through the operation unit 14.

The system control unit 11 collectively controls the entire digital camera 100, and has a hardware structure of various processors that execute programs to perform processing.

The various processors include a central processing unit (CPU) that is a general-purpose processor executing a program to perform various types of processing, a programmable logic device (PLD) that is a processor of which a circuit configuration can be changed after manufacturing such as a field programmable gate array (FPGA), or a dedicated electric circuit that is a processor having a circuit configuration designed to be dedicated to executing specific processing such as an application specific integrated circuit (ASIC).

More specifically, structures of the various processors are electric circuits in which circuit elements such as semiconductor elements are combined.

The system control unit 11 may be constituted by one of the various processors, or may be constituted by a combination of two or more processors of the same type or different types (for example, a combination of a plurality of FPGAs or a combination of a CPU and an FPGA).

Further, an electric control system of the digital camera 100 comprises a main memory 16 constituted by a random access memory (RAM), a memory control unit 15 that controls data storage in the main memory 16 and data read from the main memory 16, a digital signal processing unit 17 that performs digital signal processing on the captured image signal output from the imaging unit 50 to generate captured image data according to various formats such as a joint photographic experts group (JPEG) format, an external memory control unit 20 that controls data storage in a storage medium 21 and data read from the storage medium 21, a display unit 23 that is constituted by an organic electroluminescence (EL) display or a liquid crystal display, and a display control unit 22 that controls a display on the display unit 23.

Figure 2:
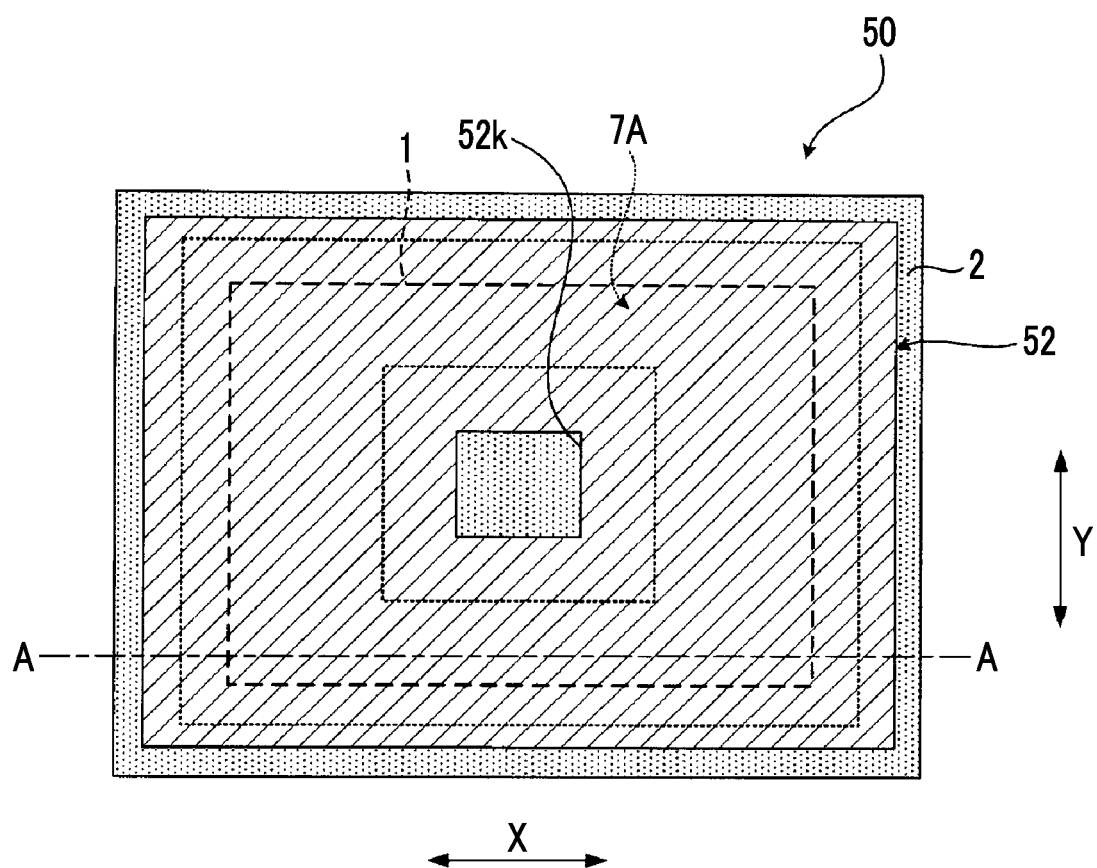
FIG. 2 is a rear view of an imaging unit 50 in the digital camera 100 shown in FIG. 1 as viewed from a circuit board 52 side.
Figure 3:
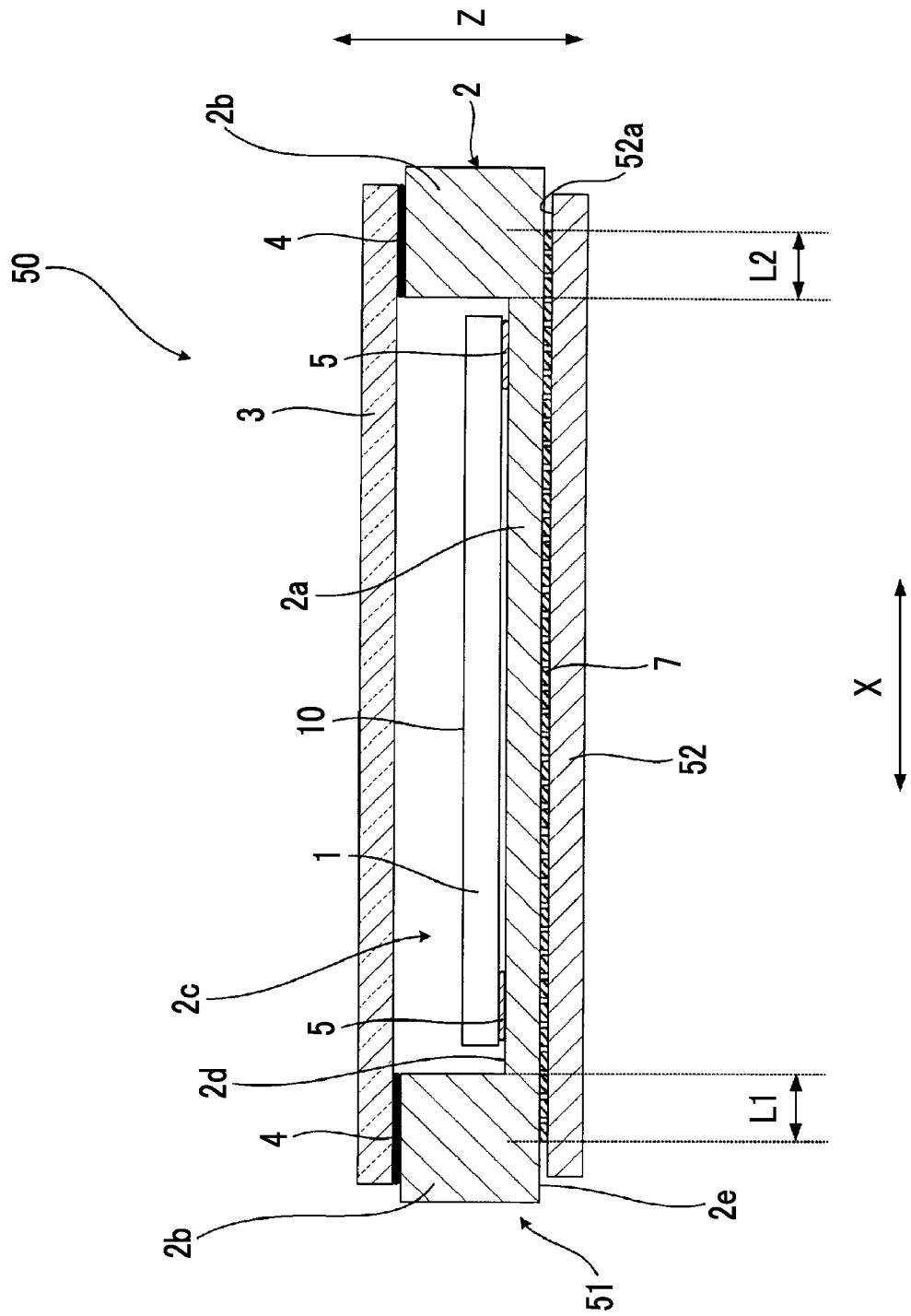
FIG. 3 is a schematic cross-sectional view taken along line A-A of the imaging unit 50 shown in FIG. 2.

FIG. 2 is a rear view of the imaging unit 50 in the digital camera 100 shown in FIG. 1 as viewed from the circuit board 52 side. FIG. 3 is a schematic cross-sectional view taken along line A-A of the imaging unit 50 shown in FIG. 2.

As shown in FIG. 3, the imaging unit 50 comprises the imaging element unit 51 and the circuit board 52 fixed to a rear surface of the imaging element unit 51.

The imaging element unit 51 comprises a package 2 that has a flat portion 2a having a plate shape such as a rectangular plate shape or a circular plate shape and a wall portion 2b erected at an end of the flat portion 2a and having a frame shape such as a rectangular frame shape or a circular frame shape. The package 2 has a structure in which a concave portion 2c is formed by the flat portion 2a and the wall portion 2b.

The imaging element unit 51 further comprises an imaging element chip 1 fixed to a fixed surface 2d of the flat portion 2a of the package 2, and a protective cover 3 constituted by a light-transmissive member such as a resin or a glass, which is fixed to an upper surface of the wall portion 2b of the package 2 with an adhesive 4 and seals the imaging element chip 1 by closing the concave portion 2c of the package 2. The package 2 constitutes a fixing member, and the protective cover 3 constitutes a sealing member. The wall portion 2b is configured to surround the fixed surface 2d of the imaging element chip 1 in the flat portion 2a.

The imaging element chip 1 is a semiconductor chip including a photoelectric conversion element such as a photodiode, and a light receiving surface 10 on which a readout circuit that converts charges accumulated in the photoelectric conversion element into signals and read out the signals is formed. The imaging element chip 1 has a rectangular planar shape as shown in FIG. 2 and is fixed to the fixed surface 2*d* of the package 2 by an adhesion member 5 such as a resin used as a die bonding material. The imaging element chip 1 is, for example, a medium size sensor (for example, 43.8 mm×32.9 mm).

FIG. 3 shows a direction Z perpendicular to the light receiving surface 10 of the imaging element chip 1 and a direction X that is a long side direction of the imaging element chip 1. FIG. 2 shows a direction Y that is a short side direction of the imaging element chip 1. FIG. 2 is a diagram of the imaging unit 50 viewed from the circuit board 52 side in the direction Z. The direction X and the direction Y are directions parallel to the light receiving surface 10.

The package 2 is constituted by an insulating material such as alumina ceramic (ceramics), or has a multilayer structure in which a conductive layer formed of a conductive member such as tungsten and an insulating layer formed of an insulating material such as alumina ceramic are laminated.

A large number of terminals (not shown) are formed on the fixed surface 2*d* of the concave portion 2*c* of the package 2, and these terminals are electrically connected to electrode pads formed on the imaging element chip 1 by conductive wires (not shown). Further, first terminals (not shown) that are electrically connected to the terminals formed on the fixed surface 2*d* of the concave portion 2*c* of the package 2 are exposed on a rear surface 2*e* of the package 2 opposite to the side to which the protective cover 3 is fixed.

The circuit board 52 is adhered and fixed to the rear surface 2*e* of the package 2 by a plurality of conductive members 7 (see FIG. 3). The conductive member 7 is in contact with each of the plurality of first terminals exposed on the rear surface 2*e* of the package 2.

The circuit board 52 is a frame-shaped and plate-shaped member having an opening 52*k* at the center in the example shown in FIG. 2. On the circuit board 52, a circuit for driving the imaging element chip 1, a circuit for processing a signal output from the imaging element chip 1, and the like are formed. On a surface 52*a* of the circuit board 52 on the side fixed to the package 2, terminals (second terminals (not shown)) of these circuits are formed at positions in contact with the conductive member 7.

Therefore, the second terminal of the circuit included in the circuit board 52 and the first terminal formed on the rear surface of the package 2 are electrically connected to each other by the conductive member 7.

The circuit board 52 includes, for example, an insulating layer made of a glass epoxy resin or the like, a conductive layer made of copper or the like, and a solder resist layer, but other well-known layers can be adopted. The circuit board 52 has a linear expansion coefficient larger than that of the package 2.

As shown in FIG. 2, the conductive member 7 is disposed in a region 7A whose planar shape is indicated by a frame-shaped broken line. The conductive member 7 may be constituted by a conductive material having an adhesion function, and for example, a solder formed of an alloy of lead and tin or a solder formed of an alloy of tin and copper is used.

Figure 4:
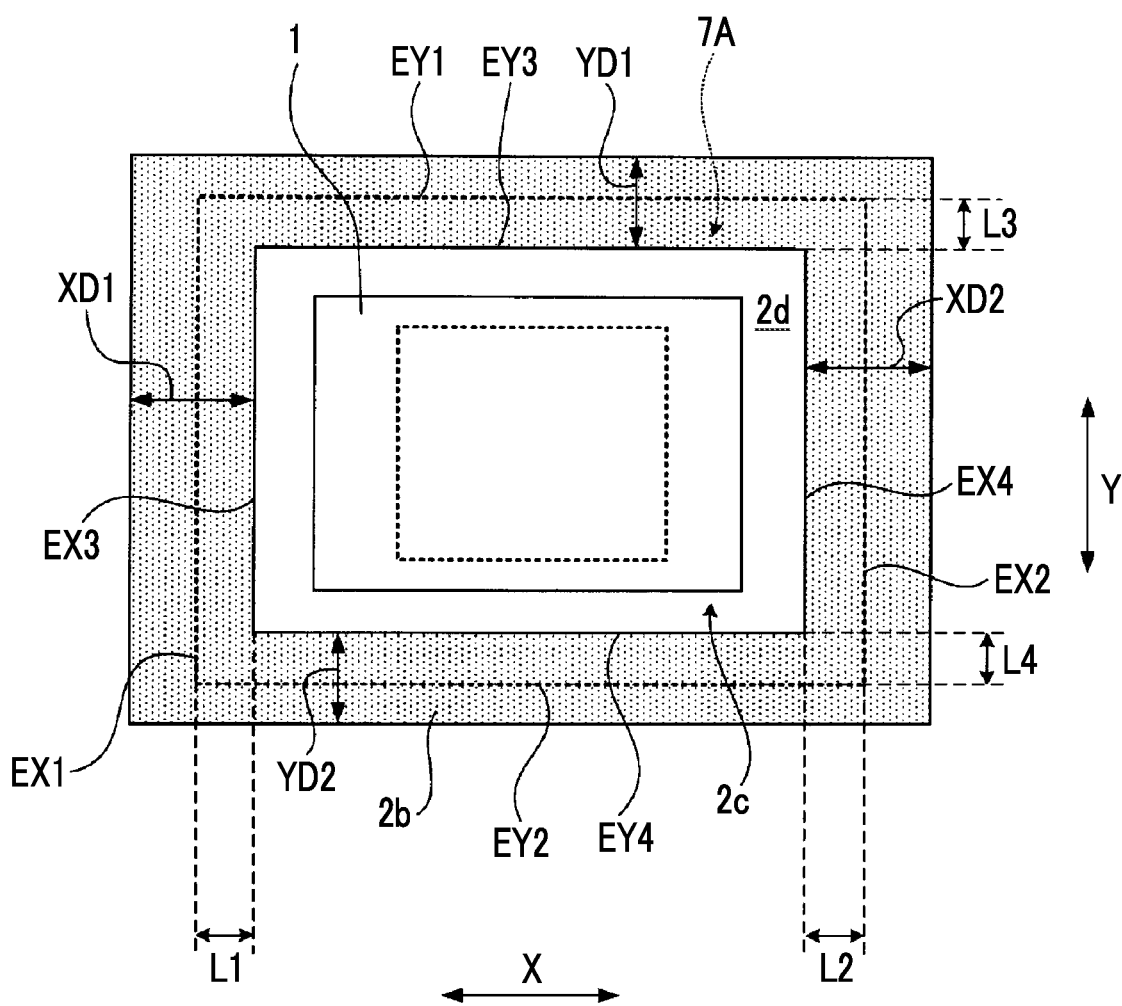
FIG. 4 is a front view of the imaging unit 50 shown in FIG. 2 as viewed in a direction from an imaging element unit 51 side.

FIG. 4 is a front view of the imaging unit 50 shown in FIG. 2 as viewed in a direction Z from the imaging element unit 51 side. In FIG. 4, the protective cover 3 shown in FIG. 3 is not shown.

As shown in FIG. 4, an outer edge of the region 7A where the conductive member 7 for fixing and electrically connecting the circuit board 52 and the package 2 to each other is formed overlaps the wall portion 2*b* of the package 2.

Specifically, the outer edge of the region 7A is constituted by an edge EX1 on one side of the region 7A in the direction X, an edge EX2 on the other side of the region 7A in the direction X, an edge EY1 on one side of the region 7A in the direction Y, and an edge EY2 on the other side of the region 7A in the direction Y. The edge EX1, the edge EX2, the edge EY1, and the edge EY2 are all located at positions overlapping the wall portion 2*b* of the package 2. The linear expansion coefficients of the circuit board 52 and the package 2 can be calculated, for example, by measuring the amount of dimensional change in a case where an external temperature is changed for the actual circuit board 52 and package 2, and converting the amount of dimensional change into the dimensional change rate per unit temperature.

In the imaging unit 50, the linear expansion coefficient of the package 2 adhered to the circuit board 52 is smaller than the linear expansion coefficient of the circuit board 52. Therefore, a stress is applied to the package 2 by a bimetal effect after the circuit board 52 and the package 2 are adhered to each other by the conductive member 7.

As shown in FIG. 4, in a case where the outer edge of the region 7A overlaps the wall portion 2*b*, the stress applied to the package 2 from the circuit board 52 is distributed to the protective cover 3 via the wall portion 2*b*. As a result, the warpage of the package 2 is reduced, and the warpage of the imaging element chip 1 can be reduced.

As shown in FIG. 4, a distance between the edge EX1 of the region 7A and an end EX3 of the wall portion 2*b* overlapping the edge EX1 on the side of the concave portion 2*c* (imaging element chip 1 side) in the direction X is denoted by L1, and a width in the direction X of the wall portion 2*b* overlapping the edge EX1 is denoted by XD1. $L1=\alpha1\times(XD1)$ As shown in FIG. 4, a distance between the edge EX2 of the region 7A and an end EX4 of the wall portion 2*b* overlapping the edge EX2 on the side of the concave portion 2*c* in the direction X is denoted by L2, and a width in the direction X of the wall portion 2*b* overlapping the edge EX2 is denoted by XD2. $L2=\alpha2\times(XD2)$ As shown in FIG. 4, a distance between the edge EY1 of the region 7A and an end EY3 of the wall portion 2*b* overlapping the edge EY1 on the side of the concave portion 2*c* in the direction Y is denoted by L3, and a width in the direction Y of the wall portion 2*b* overlapping the edge EY1 is denoted by YD1. $L3=\alpha3\times(YD1)$ As shown in FIG. 4, a distance between the edge EY2 of the region 7A and an end EY4 of the wall portion 2*b* overlapping the edge EY2 on the side of the concave portion 2*c* in the direction Y is denoted by L4, and a width in the direction Y of the wall portion 2*b* overlapping the edge EY2 is denoted by YD2. $L4=\alpha4\times(YD2)$ The distance L1 and the distance L2 may be the same value or different values. The distance L3 and the distance L4 may be the same value or different values. Further, the distances L1 to L4 may be different values.

Each of $\alpha1$, $\alpha2$, $\alpha3$, and $\alpha4$ is a ratio (overlap ratio) of the distance between the position of the wall portion 2*b* overlapping the outer edge of the region 7A and the end of the wall portion 2*b* on the side of the concave portion 2*c* side to the width of the wall portion 2*b*.

The inventor has found that, for example, in a case where each of $\alpha1$, $\alpha2$, $\alpha3$, and $\alpha4$ is set to 0.6 (overlap ratio=60%), by using an adhesive having a Young's modulus (modulus of longitudinal elasticity) of 500 MPa (megapascal) or more as the adhesive 4 for fixing the package 2 and the protective cover 3 to each other, the warpage of the imaging element chip 1 can be reduced to a practically acceptable level.

Figure 5:
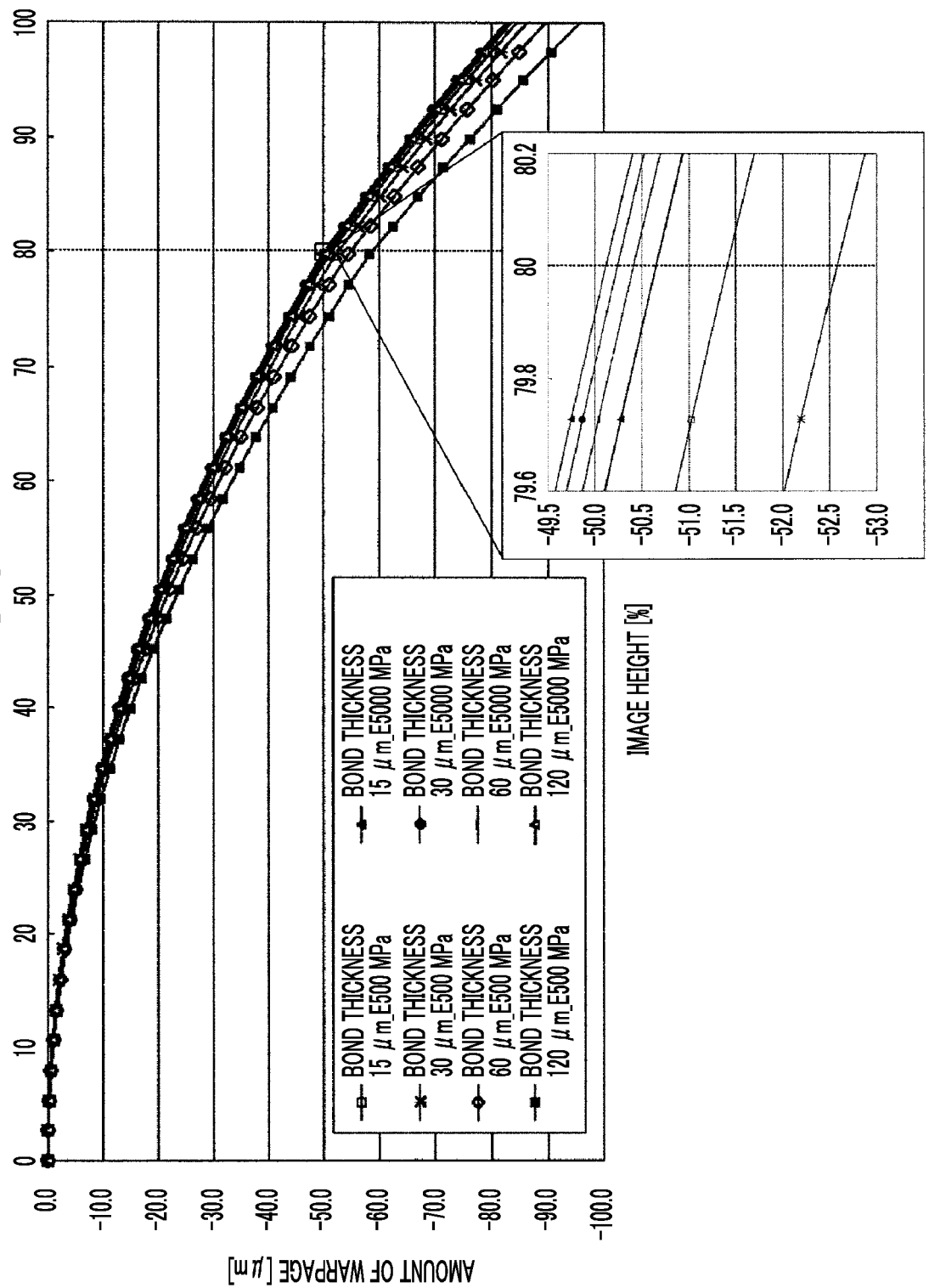
FIG. 5 is a graph showing results obtained by simulating the amount of warpage of an imaging element chip 1 in the imaging unit 50 for each combination of a thickness and a Young's modulus (500 MPa and 5000 MPa) of an adhesive 4.

FIG. 5 is a graph showing results obtained by simulating the amount of warpage of the imaging element chip 1 in the imaging unit 50 for each combination of the thickness and a Young's modulus (500 MPa and 5000 MPa) of the adhesive 4. The simulation result of FIG. 5 is a simulation result in a case where each of $\alpha1$, $\alpha2$, $\alpha3$, and $\alpha4$ described above is set to 0.6 (overlap ratio=60%) and the adhesion width of the adhesive 4 is set to 4 mm.

Here, the disposition of the adhesive with a width of X mm along a portion where the wall portion 2b overlaps the protective cover 3 in a state of being viewed from the direction Z perpendicular to the light receiving surface 10 of the imaging element chip 1 is expressed as "the adhesion width of the adhesive 4 is set to X mm".

The vertical axis shown in FIG. 5 indicates the amount of warpage (μm) of the light receiving surface 10 of the imaging element chip 1. The amount of warpage indicates a value in a case where a position in an optical axis direction at an optical axis center of the light receiving surface 10 of the imaging element chip 1 that intersects an optical axis of the imaging lens 41 is set as a reference position.

The horizontal axis shown in FIG. 5 indicates a distance from the optical axis center the light receiving surface 10 in a case where the imaging element chip is a medium size (43.8 mm×32.9 mm) as an image height (%). The optical axis center of the light receiving surface 10 has the image height of 0%, and a position of the light receiving surface 10 farthest from the optical axis center has the image height of 100%.

A curve of "BOND THICKNESS 15 μm_E 500 MPa" shown in FIG. 5 indicates a simulation result in a state where the thickness of the adhesive 4 is 15 μm and the Young's modulus of the adhesive 4 is 500 MPa.

A curve of "BOND THICKNESS 15 μm_E 5000 MPa" shown in FIG. 5 indicates a simulation result in a state where the thickness of the adhesive 4 is 15 μm and the Young's modulus of the adhesive 4 is 5000 MPa.

A curve of "BOND THICKNESS 30 μm_E 500 MPa" shown in FIG. 5 indicates a simulation result in a state where the thickness of the adhesive 4 is 30 μm and the Young's modulus of the adhesive 4 is 500 MPa.

A curve of "BOND THICKNESS 30 μm_E 5000 MPa" shown in FIG. 5 indicates a simulation result in a state where the thickness of the adhesive 4 is 30 μm and the Young's modulus of the adhesive 4 is 5000 MPa.

A curve of "BOND THICKNESS 60 μm_E 500 MPa" shown in FIG. 5 indicates a simulation result in a state where the thickness of the adhesive 4 is 60 μm and the Young's modulus of the adhesive 4 is 500 MPa.

A curve of "BOND THICKNESS 60 μm_E 5000 MPa" shown in FIG. 5 indicates a simulation result in a state where the thickness of the adhesive 4 is 60 μm and the Young's modulus of the adhesive 4 is 5000 MPa.

A curve of "BOND THICKNESS 120 μm_E 500 MPa" shown in FIG. 5 indicates a simulation result in a state where the thickness of the adhesive 4 is 120 μm and the Young's modulus of the adhesive 4 is 500 MPa.

A curve of "BOND THICKNESS 120 μm_E 5000 MPa" shown in FIG. 5 indicates a simulation result in a state where the thickness of the adhesive 4 is 120 μm and the Young's modulus of the adhesive 4 is 5000 MPa.

Figure 6:
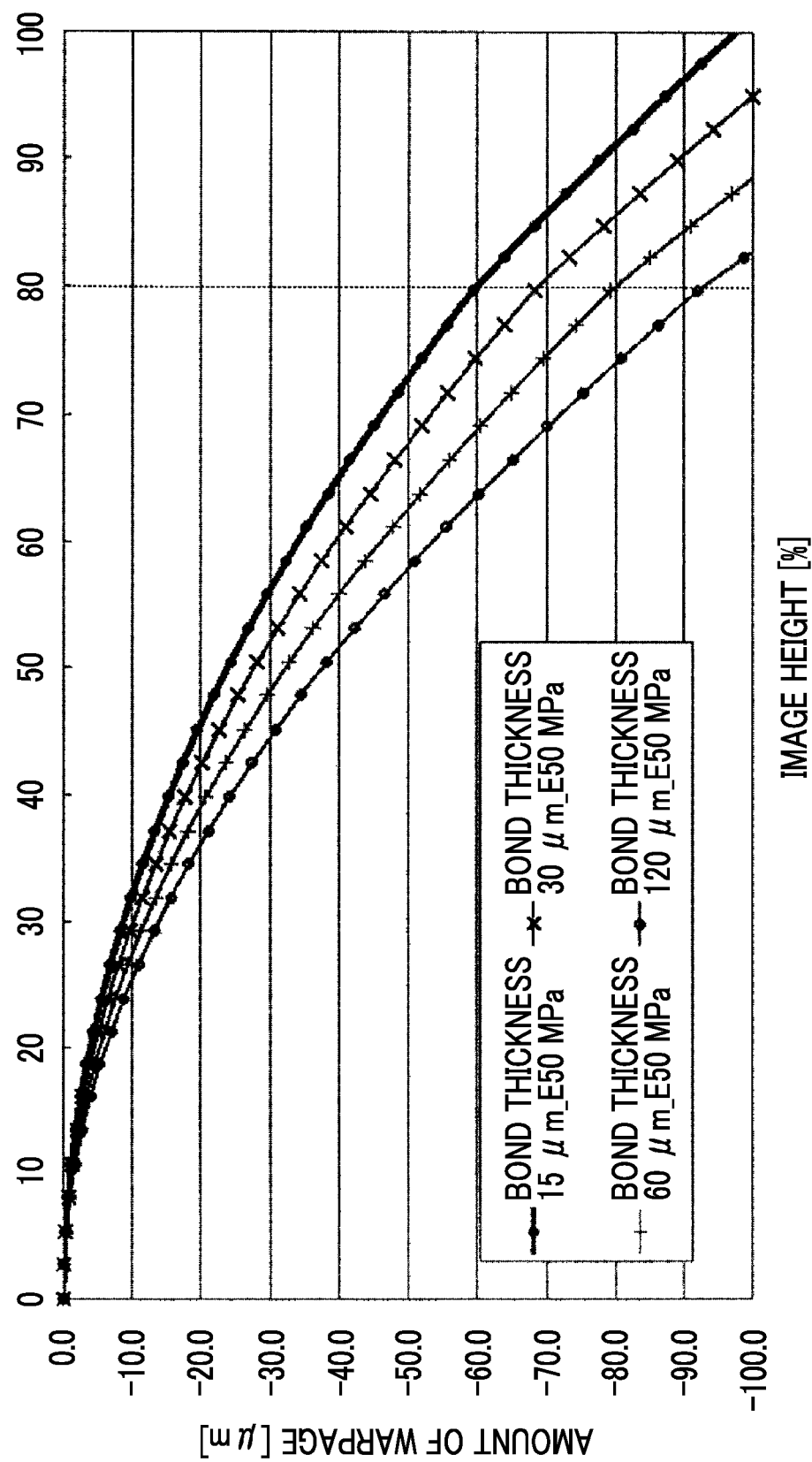
FIG. 6 is a graph showing results obtained by simulating the amount of warpage of the imaging element chip 1 in the imaging unit 50 for each combination of a thickness and a Young's modulus (50 MPa) of the adhesive 4.

FIG. 6 is a graph showing results obtained by simulating the amount of warpage of the imaging element chip 1 in the imaging unit 50 for each combination of the thickness and the Young's modulus (50 MPa) of the adhesive 4. The simulation result of FIG. 5 is a simulation result in a case where each of $\alpha1$, $\alpha2$, $\alpha3$, and $\alpha4$ described above is set to 0.6 (overlap ratio=60%) and the adhesion width of the adhesive 4 is set to 4 mm. The vertical axis and the horizontal axis shown in FIG. 6 are the same as the vertical axis and the horizontal axis shown in FIG. 5.

A curve of "BOND THICKNESS 15 μm_E 50 MPa" shown in FIG. 6 indicates a simulation result in a state where the thickness of the adhesive 4 is 15 μm and the Young's modulus of the adhesive 4 is 50 MPa.

A curve of "BOND THICKNESS 30 μm_E 50 MPa" shown in FIG. 6 indicates a simulation result in a state where the thickness of the adhesive 4 is 30 μm and the Young's modulus of the adhesive 4 is 50 MPa.

A curve of "BOND THICKNESS 60 μm_E 50 MPa" shown in FIG. 6 indicates a simulation result in a state where the thickness of the adhesive 4 is 60 μm and the Young's modulus of the adhesive 4 is 50 MPa.

A curve of "BOND THICKNESS 120 μm_E 50 MPa" shown in FIG. 6 indicates a simulation result in a state where the thickness of the adhesive 4 is 120 μm and the Young's modulus of the adhesive 4 is 50 MPa.

From the simulation results shown in FIGS. 5 and 6, it can be seen that by setting the Young's modulus of the adhesive 4 to 500 MPa or 5000 MPa, the amount of warpage of the imaging element chip 1 can be suppressed to 60 μm or less at the image height of 80% regardless of the thickness of the adhesive 4. This is the amount of warpage that can maintain the image quality even though the imaging element chip 1 is a large-sized sensor such as a medium size sensor.

Further, from the simulation results shown in FIGS. 5 and 6, it can be seen that in a case where the thickness of the adhesive 4 and the adhesion width of the adhesive 4 are the same, the higher the Young's modulus of the adhesive 4, the more the amount of warpage of the imaging element chip 1 can be suppressed.

Therefore, by setting the Young's modulus of the adhesive 4 to 500 MPa or more, the amount of warpage of the imaging element chip 1 can be suppressed to 60 μm or less at the image height of 80%, and the image quality can be maintained even though the imaging element chip 1 is a large-sized sensor such as a medium size sensor. As described above, by using an adhesive having high rigidity as the adhesive 4, the amount of warpage of the imaging element chip 1 can be suppressed. For example, a general adhesive such as Cemedine EP171 (Cemedine is a registered trademark) can be used as a highly rigid adhesive having a Young's modulus of 500 MPa or more, and a general adhesive such as Cemedine EP811 can be used as a highly rigid adhesive having a Young's modulus of 5000 MPa or more.

In the simulation result shown in FIG. 5, in a case where the thickness of the adhesive 4 is 120 μm, the amount of warpage of the imaging element chip 1 is suppressed to 60 μm or less at the image height of 80%. Further, from the simulation result shown in FIG. 5, it can be seen that in a case where the Young's modulus of the adhesive 4 and the adhesion width of the adhesive 4 are the same, the smaller the thickness of the adhesive 4, the more the amount of warpage of the imaging element chip 1 can be suppressed. Therefore, in a case where the Young's modulus of the adhesive 4 is set to 500 MPa or more, the thickness of the adhesive 4 is preferably 120 μm or less.

As described above, the simulation result shown in FIG. 5 is a simulation result in a case where the adhesion width of the adhesive 4 is 4 mm. Further, from the simulation results shown in FIGS. 7 and 8 described below, it can be seen that in a case where the Young's modulus of the adhesive 4 and the thickness of the adhesive 4 are the same, the larger the adhesion width of the adhesive 4, the more the amount of warpage of the imaging element chip 1 can be suppressed. Therefore, in a case where the Young's modulus of the adhesive 4 is set to 500 MPa or more, the adhesion width of the adhesive 4 is preferably 4 mm or more.

From the simulation result shown in FIG. 6, it can be seen that even though the Young's modulus of the adhesive 4 is 50 MPa, which is less than 500 MPa, the amount of warpage of the imaging element chip 1 can be suppressed to 60 μm or less at the image height of 80% in a case where the thickness of the adhesive 4 is 15 μm. Further, from the simulation result shown in FIG. 6, it can be seen that the smaller the thickness of the adhesive 4, the more the amount of warpage of the imaging element chip 1 can be suppressed.

Therefore, even though the Young's modulus of the adhesive 4 is less than 500 MPa, by setting the thickness of the adhesive 4 to 15 μm or less, the amount of warpage of the imaging element chip 1 can be suppressed to 60 μm or less at the image height of 80%, and the image quality can be maintained even though the imaging element chip 1 is a large-sized sensor such as a medium size sensor. As described above, in a case where the adhesive 4 is an adhesive having low rigidity (for example, an ultra violet (UV) adhesive), the amount of warpage of the imaging element chip 1 can be suppressed by thinning the adhesive 4.

As described above, the simulation result shown in FIG. 6 is a simulation result in a case where the adhesion width of the adhesive 4 is 4 mm. Further, as described above, the larger the adhesion width of the adhesive 4, the more the amount of warpage of the imaging element chip 1 can be suppressed. Therefore, in a case where the Young's modulus of the adhesive 4 is set to less than 500 MPa and the thickness of the adhesive 4 is set to 15 μm or less, the adhesion width of the adhesive 4 is preferably 4 mm or more.

Figure 7:
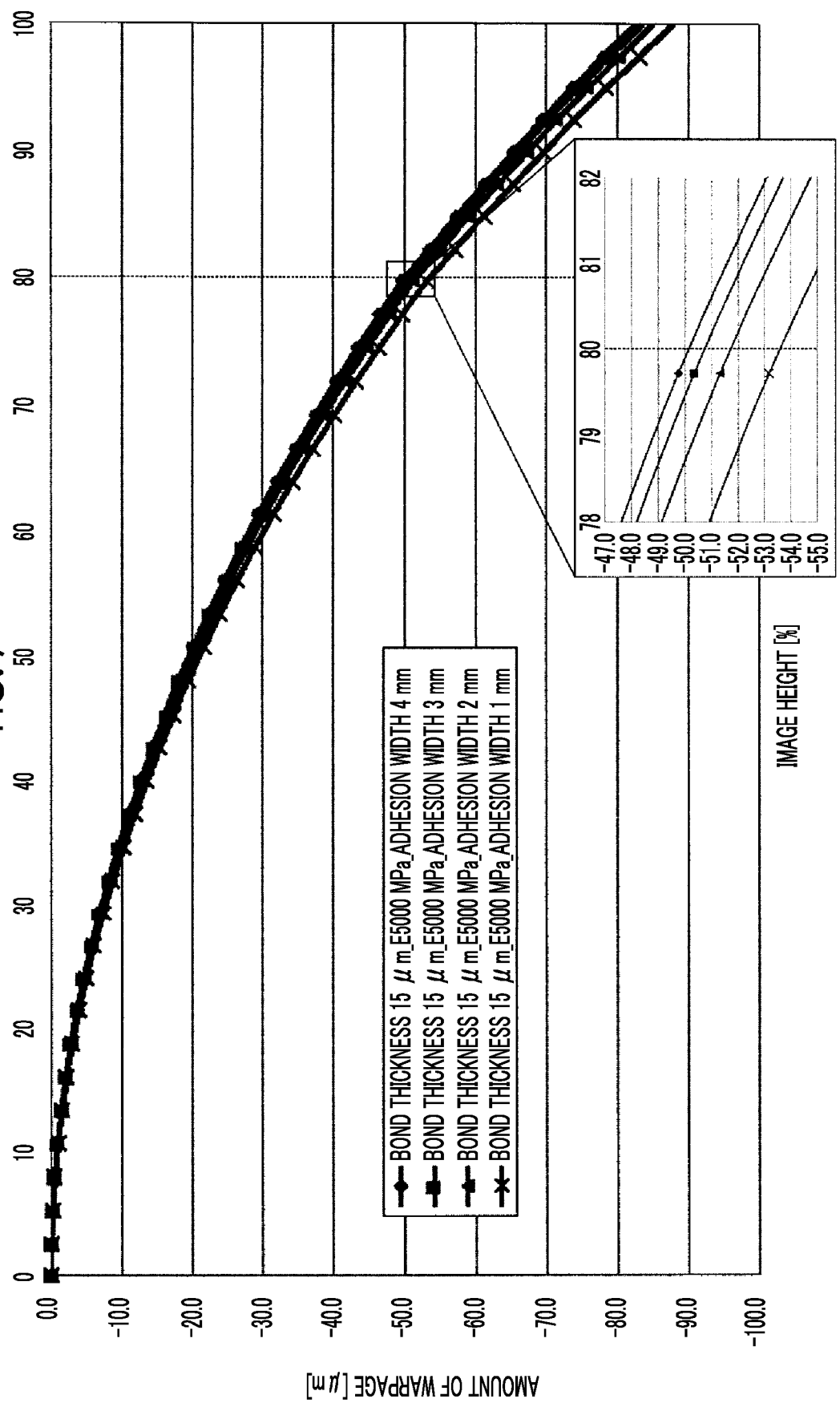
FIG. 7 is a graph showing results obtained by simulating the amount of warpage of the imaging element chip 1 in the imaging unit 50 for each adhesion width of the adhesive 4 (thickness=15 µm, Young's modulus=5000 MPa).

FIG. 7 is a graph showing results obtained by simulating the amount of warpage of the imaging element chip 1 in the imaging unit 50 for each adhesion width of the adhesive 4 (thickness=15 μm, Young's modulus=5000 MPa). The simulation result of FIG. 7 is a simulation result in a case where each of α1, α2, α3, and α4 described above is set to 0.6 (overlap ratio=60%). The vertical axis and the horizontal axis shown in FIG. 7 are the same as the vertical axis and the horizontal axis shown in FIG. 5.

A curve of "BOND THICKNESS 15 μm_E 5000 MPa_ADHESION WIDTH 4 mm" shown in FIG. 7 indicates a simulation result in a state where the thickness of the adhesive 4 is 15 μm, the Young's modulus of the adhesive 4 is 5000 MPa, and the adhesion width of the adhesive 4 is 4 mm.

A curve of "BOND THICKNESS 15 μm_E 5000 MPa_ADHESION WIDTH 3 mm" shown in FIG. 7 indicates a simulation result in a state where the thickness of the adhesive 4 is 15 μm, the Young's modulus of the adhesive 4 is 5000 MPa, and the adhesion width of the adhesive 4 is 3 mm.

A curve of "BOND THICKNESS 15 μm_E 5000 MPa_ADHESION WIDTH 2 mm" shown in FIG. 7 indicates a simulation result in a state where the thickness of the adhesive 4 is 15 μm, the Young's modulus of the adhesive 4 is 5000 MPa, and the adhesion width of the adhesive 4 is 2 mm.

A curve of "BOND THICKNESS 15 μm_E 5000 MPa_ADHESION WIDTH 1 mm" shown in FIG. 7 indicates a simulation result in a state where the thickness of the adhesive 4 is 15 μm, the Young's modulus of the adhesive 4 is 5000 MPa, and the adhesion width of the adhesive 4 is 1 mm.

From the simulation result shown in FIG. 7, it can be seen that in a case where the Young's modulus of the adhesive 4 is 5000 MPa, the amount of warpage of the imaging element chip 1 can be suppressed to 60 μm or less at the image height of 80% regardless of the adhesion width of the adhesive 4. Further, as described above, the higher the Young's modulus of the adhesive 4, the more the amount of warpage of the imaging element chip 1 can be suppressed.

Therefore, by setting the Young's modulus of the adhesive 4 to 5000 MPa or more, the amount of warpage of the imaging element chip 1 can be suppressed to 60 μm or less at the image height of 80%, and the image quality can be maintained even though the imaging element chip 1 is a large-sized sensor such as a medium size sensor.

In the simulation result shown in FIG. 7, in a case where the adhesion width of the adhesive 4 is 1 mm, the amount of warpage of the imaging element chip 1 is suppressed to 60 μm or less at the image height of 80%. Further, as described above, the larger the adhesion width of the adhesive 4, the more the amount of warpage of the imaging element chip 1 can be suppressed. Therefore, in a case where the Young's modulus of the adhesive 4 is set to 5000 MPa or more, the adhesion width of the adhesive 4 is preferably 1 mm or more. It is usually difficult to make the adhesion width of the adhesive 4 less than 1 mm.

In the simulation result shown in FIG. 7, in a case where the thickness of the adhesive 4 is 15 μm, the amount of warpage of the imaging element chip 1 is suppressed to 60 μm or less at the image height of 80% regardless of the adhesion width of the adhesive 4. Further, as described above, the smaller the thickness of the adhesive 4, the more the amount of warpage of the imaging element chip 1 can be suppressed. Therefore, in a case where the Young's modulus of the adhesive 4 is set to 5000 MPa or more, the thickness of the adhesive 4 is preferably 15 μm or less.

Figure 8:
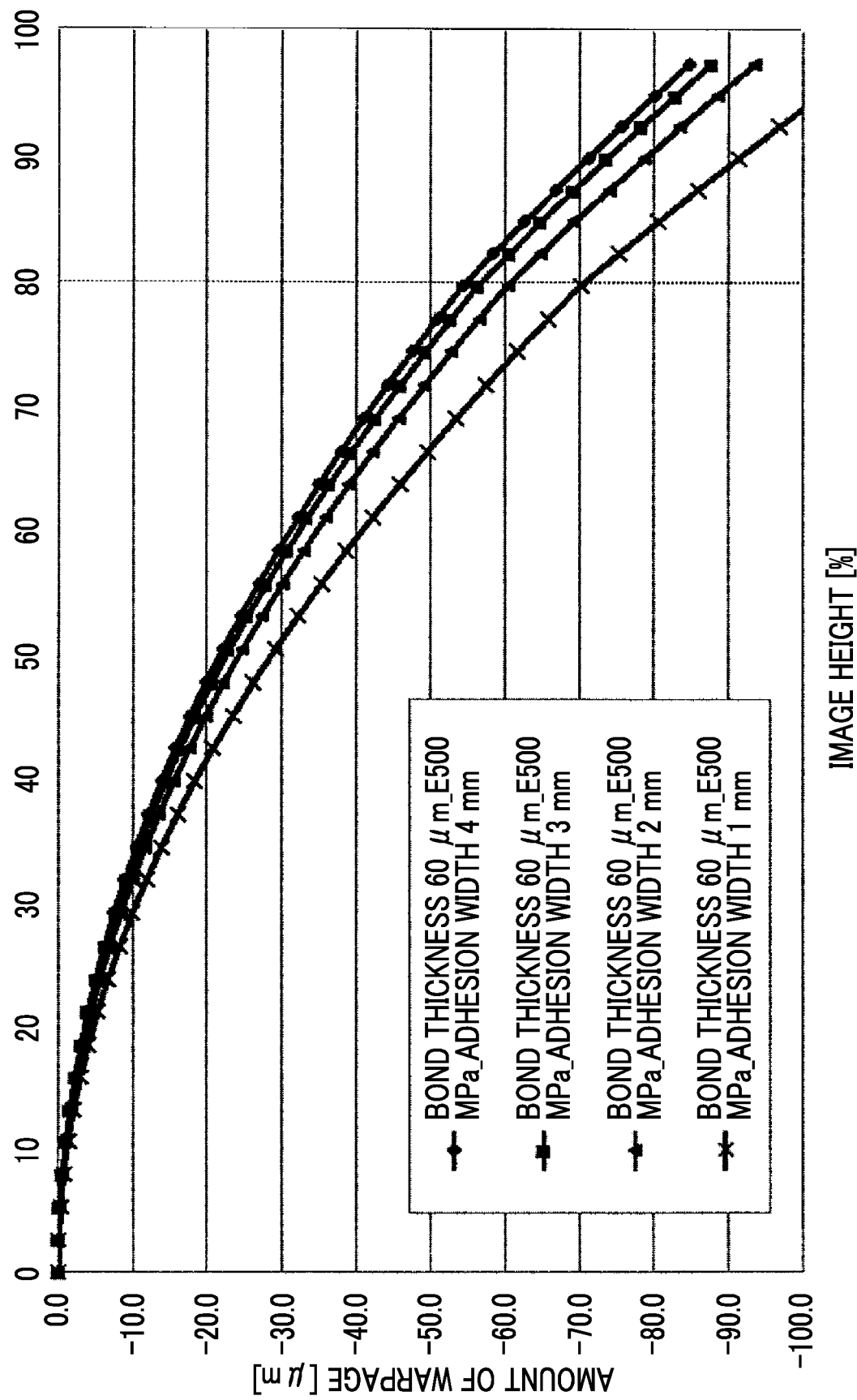
FIG. 8 is a graph showing results obtained by simulating the amount of warpage of the imaging element chip 1 in the imaging unit 50 for each adhesion width of the adhesive 4 (thickness=60 µm, Young's modulus=500 MPa).

FIG. 8 is a graph showing results obtained by simulating the amount of warpage of the imaging element chip 1 in the imaging unit 50 for each adhesion width of the adhesive 4 (thickness=60 μm, Young's modulus=500 MPa). The simulation result of FIG. 8 is a simulation result in a case where each of α1, α2, α3, and α4 described above is set to 0.6 (overlap ratio=60%). The vertical axis and the horizontal axis shown in FIG. 8 are the same as the vertical axis and the horizontal axis shown in FIG. 5.

A curve of "BOND THICKNESS 60 μm_E 500 MPa_ADHESION WIDTH 4 mm" shown in FIG. 8 indicates a simulation result in a state where the thickness of the adhesive 4 is 60 μm, the Young's modulus of the adhesive 4 is 500 MPa, and the adhesion width of the adhesive 4 is 4 mm.

A curve of "BOND THICKNESS 60 μm_E 500 MPa_ADHESION WIDTH 3 mm" shown in FIG. 8 indicates a simulation result in a state where the thickness of the adhesive 4 is 60 μm, the Young's modulus of the adhesive 4 is 500 MPa, and the adhesion width of the adhesive 4 is 3 mm.

A curve of "BOND THICKNESS 60 μm_E 500 MPa_ADHESION WIDTH 2 mm" shown in FIG. 8 indicates a simulation result in a state where the thickness of the adhesive 4 is 60 µm, the Young's modulus of the adhesive 4 is 500 MPa, and the adhesion width of the adhesive 4 is 2 mm.

A curve of "BOND THICKNESS 60 µm_E 500 MPa_ADHESION WIDTH 1 mm" shown in FIG. 8 indicates a simulation result in a state where the thickness of the adhesive 4 is 60 µm, the Young's modulus of the adhesive 4 is 500 MPa, and the adhesion width of the adhesive 4 is 1 mm.

From the simulation result shown in FIG. 8, it can be seen that in a case where the Young's modulus of the adhesive 4 is 500 MPa, which is less than 5000 MPa, the amount of warpage of the imaging element chip 1 can be suppressed to 60 µm or less at the image height of 80% in a case where the adhesion width of the adhesive 4 is 3 mm or 4 mm. Further, as described above, the larger the adhesion width of the adhesive 4, the more the amount of warpage of the imaging element chip 1 can be suppressed.

Therefore, in a case where the Young's modulus of the adhesive 4 is less than 5000 MPa, by setting the adhesion width of the adhesive 4 to 3 mm or more, the amount of warpage of the imaging element chip 1 can be suppressed to 60 µm or less at the image height of 80%, and the image quality can be maintained even though the imaging element chip 1 is a large-sized sensor such as a medium size sensor.

In the simulation result shown in FIG. 8, in a case where the thickness of the adhesive 4 is 60 µm, the amount of warpage of the imaging element chip 1 is suppressed to 60 µm or less at the image height of 80% in the adhesion width of 3 mm and the adhesion width of 4 mm. Further, as described above, the smaller the thickness of the adhesive 4, the more the amount of warpage of the imaging element chip 1 can be suppressed. Therefore, in a case where the Young's modulus of the adhesive 4 is set to less than 5000 MPa and the adhesion width of the adhesive 4 is set to 3 mm or more, the thickness of the adhesive 4 is preferably 60 µm or less.

The conditions for the adhesive 4 in a case where each of $\alpha 1$, $\alpha 2$, $\alpha 3$, and $\alpha 4$ described above is 0.6, that is, in a case where the overlap ratio is 60% have been described, but even in a case where the overlap ratio is not 60%, the conditions for the adhesive 4 can be used. This point will be described with reference to FIG. 9.

FIG. 9 is a graph showing results obtained by simulating the amount of warpage of the imaging element chip 1 in the imaging unit 50 for each overlap ratio. The vertical axis and the horizontal axis shown in FIG. 9 are the same as the vertical axis and the horizontal axis shown in FIG. 5.

A curve of "NO OVERLAP 1" shown in FIG. 9 indicates a simulation result in a state where the outer edge of the region 7A overlaps the fixed surface 2d instead of the wall portion 2b.

A curve of "NO OVERLAP 2" shown in FIG. 9 indicates a simulation result in a state where the outer edge of the region 7A overlaps the fixed surface 2d instead of the wall portion 2b, and the outer edge of the region 7A is located closer to the wall portion 2b than in the case of "NO OVERLAP 1".

A curve of "OVERLAP 0%" shown in FIG. 9 indicates a simulation result in a state where the outer edge of the region 7A overlaps the end of the wall portion 2b on the side of the concave portion 2c (state where $\alpha 1$, $\alpha 2$, $\alpha 3$, and $\alpha 4$ described above are all 0).

A curve of "OVERLAP 10%" shown in FIG. 9 indicates a simulation result in a state where the outer edge of the region 7A overlaps the wall portion 2b, and $\alpha 1$, $\alpha 2$, $\alpha 3$, and $\alpha 4$ described above are all 0.1.

A curve of "OVERLAP 20%" shown in FIG. 9 indicates a simulation result in a state where the outer edge of the region 7A overlaps the wall portion 2b, and $\alpha 1$, $\alpha 2$, $\alpha 3$, and $\alpha 4$ described above are all 0.2.

A curve of "OVERLAP 60%" shown in FIG. 9 indicates a simulation result in a state where the outer edge of the region 7A overlaps the wall portion 2b, and $\alpha 1$, $\alpha 2$, $\alpha 3$, and $\alpha 4$ described above are all 0.6.

A curve of "OVERLAP 80%" shown in FIG. 9 indicates a simulation result in a state where the outer edge of the region 7A overlaps the wall portion 2b, and $\alpha 1$, $\alpha 2$, $\alpha 3$, and $\alpha 4$ described above are all 0.8.

A curve of "OVERLAP 100%" shown in FIG. 9 indicates a simulation result in a state where the outer edge of the region 7A overlaps the end of the wall portion 2b on a side opposite to the side of the concave portion 2c (state where $\alpha 1$, $\alpha 2$, $\alpha 3$, and $\alpha 4$ described above are all 1.0).

From the simulation result shown in FIG. 9, it can be seen that the amount of warpage of the imaging element chip 1 can be reduced by overlapping the outer edge of the region 7A with the wall portion 2b.

Further, from the result shown in FIG. 9, it can be seen that the amount of warpage of the imaging element chip 1 can be reduced to about 60 µm at the image height of 80%, not only in a case where each of $\alpha 1$, $\alpha 2$, $\alpha 3$, and $\alpha 4$ is 0.6 (overlap ratio=60%), but also in a case where each of $\alpha 1$, $\alpha 2$, $\alpha 3$, and $\alpha 4$ described above is 0.2 or more and 1.0 or less. Furthermore, it can be seen that in a case where each of $\alpha 1$, $\alpha 2$, $\alpha 3$, and $\alpha 4$ described above is in a range of 0.2 or more and 0.6 or less, the amount of warpage of the imaging element chip 1 can be further reduced. Therefore, each of $\alpha 1$, $\alpha 2$, $\alpha 3$, and $\alpha 4$ is set to, for example, 0.2 or more and 1.0 or less, and preferably 0.2 or more and 0.6 or less.

As described above, according to the imaging unit 50, since the outer edge of the region 7A overlaps the wall portion 2b and the adhesive 4 satisfies the above conditions, the stress is efficiently dispersed in the protective cover 3, and the warpage of the imaging element chip 1 due to a bimetal effect can be reduced, and the imaging quality can be improved.

In the imaging unit 50 described above, the circuit board 52 is configured to have the opening 52k, and thus the shape of the region 7A is frame-shaped. However, in a case where the circuit board 52 has a flat plate shape without the opening 52k, the planar shape of the region 7A may be rectangular.

As described above, the following items are described in the present specification.

(1)

An imaging element unit that is fixed to a circuit board through a conductive member, the imaging element unit comprising:

a fixing member that includes a flat portion to which an imaging element chip is fixed, a wall portion surrounding a fixed surface of the imaging element chip in the flat portion, and a plurality of first terminals electrically connected to the imaging element chip, and that has a linear expansion coefficient smaller than a linear expansion coefficient of the circuit board to which the imaging element unit is fixed; and a sealing member that seals the imaging element chip in a state where the sealing member overlaps the wall portion, wherein the sealing member and the wall portion are fixed by an adhesive having a Young's modulus of 500 MPa or more.

(2)
The imaging element unit according to (1),
wherein the adhesive is disposed with a width of 3 mm or more along a portion where the wall portion overlaps the sealing member in a state of being viewed from the direction perpendicular to the light receiving surface of the imaging element chip.

(3)
The imaging element unit according to (2),
wherein the Young's modulus of the adhesive is less than 5000 MPa.

(4)
The imaging element unit according to (2) or (3),
wherein a thickness of the adhesive is 60 µm or less.

(5)
The imaging element unit according to (1),
wherein the Young's modulus of the adhesive is 5000 MPa or more.

(6)
The imaging element unit according to (5),
wherein the adhesive is disposed with a width of 1 mm or more along a portion where the wall portion overlaps the sealing member in a state of being viewed from the direction perpendicular to the light receiving surface of the imaging element chip.

(7)
The imaging element unit according to (5) or (6),
wherein a thickness of the adhesive is 15 µm or less.

(8)
An imaging element unit that is fixed to a circuit board through a conductive member, the imaging element unit comprising:
a fixing member that includes a flat portion to which an imaging element chip is fixed, a wall portion surrounding a fixed surface of the imaging element chip in the flat portion, and a plurality of first terminals electrically connected to the imaging element chip, and that has a linear expansion coefficient smaller than a linear expansion coefficient of the circuit board to which the imaging element unit is fixed; and
a sealing member that seals the imaging element chip in a state where the sealing member overlaps the wall portion,
wherein the sealing member and the wall portion are fixed by an adhesive having a Young's modulus of less than 500 MPa and a thickness of 15 µm or less.

(9)
The imaging element unit according to any one of (1) to (8),
wherein the conductive member is provided between the first terminal exposed from a surface of the fixing member opposite to the fixed surface and a second terminal formed on the circuit board disposed to face the surface of the fixing member opposite to the fixed surface, to fix the fixing member and the circuit board and electrically connect the first terminal and the second terminal to each other, and
in a state of being viewed from the direction perpendicular to the light receiving surface of the imaging element chip, an outer edge of a region where the conductive member is disposed overlaps the wall portion of the fixing member.

(10)
The imaging element unit according to (9),
wherein a distance between a position of the wall portion overlapping the outer edge and an end of the wall portion on a side of the imaging element chip is 20% or more and 60% or less of a width of the wall portion in a direction parallel to the light receiving surface.

(11)
The imaging element unit according to (9),
wherein a distance between a position of the wall portion overlapping the outer edge and an end of the wall portion on a side of the imaging element chip is 60% of a width of the wall portion in a direction parallel to the light receiving surface.

(12)
The imaging element unit according to any one of (1) to (11),
wherein the flat portion and the wall portion are made of a ceramic, and
the sealing member is made of glass.

(13)
An imaging device comprising:
the imaging element unit according to any one of (1) to (12);
the circuit board; and
the conductive member provided between the first terminal exposed from a surface of the fixing member opposite to the fixed surface and a second terminal formed on the circuit board disposed to face the surface of the fixing member opposite to the fixed surface, to fix the fixing member and the circuit board and electrically connect the first terminal and the second terminal to each other.

The present invention is highly convenient and effective to be applied to an electronic device having an imaging function, such as a digital camera, a smartphone, a tablet terminal, a personal computer, a robot, or an endoscope.

EXPLANATION OF REFERENCES

100: digital camera
11: system control unit
14: operation unit
40: lens device
41: imaging lens
42: stop
43: lens driving unit
44: stop driving unit
45: lens control unit
50: imaging unit
51: imaging element unit
52: circuit board
15: memory control unit
16: main memory
17: digital signal processing unit
20: external memory control unit
21: storage medium
22: display control unit
23: display unit
1: imaging element chip
2: package
2a: flat portion
2b: wall portion
2c: concave portion
2d: fixed surface
2e: rear surface
3: protective cover
4: adhesive
5: adhesion member
7: conductive member
7A: region
10: light receiving surface 52a: surface
52k: opening
EX1, EX2, EY1, EY2: edge
EX3, EX4, EY3, EY4: end
L1, L2, L3, L4: distance
XD1, XD2, YD1, YD2: width

What is claimed is:

1. An imaging element unit that is fixed to a circuit board through a conductive member, the imaging element unit comprising:
a fixing member that includes a flat portion to which an imaging element chip is fixed, a wall portion surrounding a fixed surface of the imaging element chip in the flat portion, and a plurality of first terminals electrically connected to the imaging element chip, and that has a linear expansion coefficient smaller than a linear expansion coefficient of the circuit board to which the imaging element unit is fixed; and
a sealing member that seals the imaging element chip in a state where the sealing member overlaps the wall portion in a case of being viewed from a direction perpendicular to a light receiving surface of the imaging element chip,
wherein the sealing member and the wall portion are fixed by an adhesive having a Young's modulus of 500 MPa or more.

2. The imaging element unit according to claim 1, wherein the adhesive is disposed with a width of 3 mm or more along a portion where the wall portion overlaps the sealing member in a state of being viewed from the direction perpendicular to the light receiving surface of the imaging element chip.

3. The imaging element unit according to claim 2, wherein the Young's modulus of the adhesive is less than 5000 MPa.

4. The imaging element unit according to claim 2, wherein a thickness of the adhesive is 60 μm or less.

5. The imaging element unit according to claim 3, wherein a thickness of the adhesive is 60 μm or less.

6. The imaging element unit according to claim 1, wherein the Young's modulus of the adhesive is 5000 MPa or more.

7. The imaging element unit according to claim 6, wherein the adhesive is disposed with a width of 1 mm or more along a portion where the wall portion overlaps the sealing member in a state of being viewed from the direction perpendicular to the light receiving surface of the imaging element chip.

8. The imaging element unit according to claim 6, wherein a thickness of the adhesive is 15 μm or less.

9. The imaging element unit according to claim 7, wherein a thickness of the adhesive is 15 μm or less.

10. An imaging element unit that is fixed to a circuit board through a conductive member, the imaging element unit comprising:
a fixing member that includes a flat portion to which an imaging element chip is fixed, a wall portion surrounding a fixed surface of the imaging element chip in the flat portion, and a plurality of first terminals electrically connected to the imaging element chip, and that has a linear expansion coefficient smaller than a linear expansion coefficient of the circuit board to which the imaging element unit is fixed; and
a sealing member that seals the imaging element chip in a state where the sealing member overlaps the wall portion in a case of being viewed from a direction perpendicular to a light receiving surface of the imaging element chip,
wherein the sealing member and the wall portion are fixed by an adhesive having a Young's modulus of less than 500 MPa and a thickness of 15 μm or less.

11. The imaging element unit according to claim 1, wherein the conductive member is provided between the first terminal exposed from a surface of the fixing member opposite to the fixed surface and a second terminal formed on the circuit board disposed to face the surface of the fixing member opposite to the fixed surface, to fix the fixing member and the circuit board and electrically connect the first terminal and the second terminal to each other, and
in a state of being viewed from the direction perpendicular to the light receiving surface of the imaging element chip, an outer edge of a region where the conductive member is disposed overlaps the wall portion of the fixing member.

12. The imaging element unit according to claim 2, wherein the conductive member is provided between the first terminal exposed from a surface of the fixing member opposite to the fixed surface and a second terminal formed on the circuit board disposed to face the surface of the fixing member opposite to the fixed surface, to fix the fixing member and the circuit board and electrically connect the first terminal and the second terminal to each other, and
in a state of being viewed from the direction perpendicular to the light receiving surface of the imaging element chip, an outer edge of a region where the conductive member is disposed overlaps the wall portion of the fixing member.

13. The imaging element unit according to claim 3, wherein the conductive member is provided between the first terminal exposed from a surface of the fixing member opposite to the fixed surface and a second terminal formed on the circuit board disposed to face the surface of the fixing member opposite to the fixed surface, to fix the fixing member and the circuit board and electrically connect the first terminal and the second terminal to each other, and
in a state of being viewed from the direction perpendicular to the light receiving surface of the imaging element chip, an outer edge of a region where the conductive member is disposed overlaps the wall portion of the fixing member.

14. The imaging element unit according to claim 10, wherein the conductive member is provided between the first terminal exposed from a surface of the fixing member opposite to the fixed surface and a second terminal formed on the circuit board disposed to face the surface of the fixing member opposite to the fixed surface, to fix the fixing member and the circuit board and electrically connect the first terminal and the second terminal to each other, and
in a state of being viewed from the direction perpendicular to the light receiving surface of the imaging element chip, an outer edge of a region where the conductive member is disposed overlaps the wall portion of the fixing member.

15. The imaging element unit according to claim 11,
wherein a distance between a position of the wall portion overlapping the outer edge and an end of the wall portion on a side of the imaging element chip is 20% or more and 60% or less of a width of the wall portion in a direction parallel to the light receiving surface.

16. The imaging element unit according to claim 11,
wherein a distance between a position of the wall portion overlapping the outer edge and an end of the wall portion on a side of the imaging element chip is 60% of a width of the wall portion in a direction parallel to the light receiving surface.

17. The imaging element unit according to claim 1,
wherein the flat portion and the wall portion are made of a ceramic, and
the sealing member is made of glass.

18. The imaging element unit according to claim 10,
wherein the flat portion and the wall portion are made of a ceramic, and
the sealing member is made of glass.

19. An imaging device comprising:
the imaging element unit according to of claim 1;
the circuit board; and
the conductive member provided between the first terminal exposed from a surface of the fixing member opposite to the fixed surface and a second terminal formed on the circuit board disposed to face the surface of the fixing member opposite to the fixed surface, to fix the fixing member and the circuit board and electrically connect the first terminal and the second terminal to each other.

20. An imaging device comprising:
the imaging element unit according to of claim 10;
the circuit board; and
the conductive member provided between the first terminal exposed from a surface of the fixing member opposite to the fixed surface and a second terminal formed on the circuit board disposed to face the surface of the fixing member opposite to the fixed surface, to fix the fixing member and the circuit board and electrically connect the first terminal and the second terminal to each other.

* * * * *